United States Patent [19]
Watanabe

[11] Patent Number: 5,308,955
[45] Date of Patent: May 3, 1994

[54] VERTICAL HEAT TREATMENT APPARATUS WITH VENTED HEAT INSULATION COVER MEANS

[75] Inventor: Shingo Watanabe, Kanagawa, Japan

[73] Assignee: Tokyo Electron Sagami Kabushiki Kaisha, Shiroyama, Japan

[21] Appl. No.: 910,579

[22] Filed: Jul. 8, 1992

[30] Foreign Application Priority Data

Jul. 11, 1991 [JP] Japan .................................. 3-198433

[51] Int. Cl.⁵ .......................................... H01L 21/00
[52] U.S. Cl. .................................. 219/390; 392/416; 118/725; 118/730
[58] Field of Search .................. 219/390, 405, 411; 392/416, 418; 118/724, 725, 730, 728

[56] References Cited

U.S. PATENT DOCUMENTS

| | | | |
|---|---|---|---|
| 4,926,793 | 5/1990 | Arima et al. | 118/725 |
| 5,029,554 | 7/1991 | Miyashita et al. | 118/724 |
| 5,127,365 | 7/1992 | Koyama et al. | 118/724 |
| 5,171,972 | 12/1992 | Hidano | 219/390 |

FOREIGN PATENT DOCUMENTS

3-194933 8/1991 Japan .................................. 118/725

Primary Examiner—Geoffrey S. Evans
Assistant Examiner—John A. Jeffery
Attorney, Agent, or Firm—Beveridge, DeGrandi, Weilacher & Young

[57] ABSTRACT

In a vertical type of heat treatment apparatus, a cover for covering an opening portion at a lower end of a reaction chamber is configured from a heat retention cylinder cover and a heat retention cylinder support plate. This cover is made so that the lower end is open and so that the upper end is a cylindrical shape with a closed end. The heat retention cylinder is disposed inside a region which is surrounded by the cover, and the heat retention cylinder is supported by the support plate, and the closed end portion of the heat retention cylinder and the support plate both have vent holes formed therein so that the inside of the heat retention cylinder is maintained at atmospheric pressure. The cover airtightly separates the heat retention cylinder from the heat treating region and so there is no contamination from the heat retention cylinder, and the heat retention cylinder is maintained at atmospheric pressure and so there is no danger of destruction of the heat retention portion.

10 Claims, 4 Drawing Sheets

VERTICAL HEAT TREATMENT APPARATUS WITH VENTED HEAT INSULATION COVER MEANS

BACKGROUND OF THE INVENTION

The present invention relates to vertical heat treatment apparatus.

As far as apparatus which perform heat treatment such as the oxidation, diffusion and CVD processing for semiconductor wafers are concerned, the vertical type of heat treatment apparatus is replacing the conventional horizontal type thereof since there is little intake of air into the reaction chamber when the wafers are loaded and unloaded, and it is possible to control the growth of natural oxide films.

The following is a brief description of a conventional vertical type of oxidation and diffusion furnace, with reference to FIG. 5. This oxidation and diffusion furnace comprises an inside tube 1a and an outside tube 1b, and a boat elevator 22 loads a wafer boat 21 on which a plural number of wafers W are loaded, from a lower end opening portion 23a to inside the reaction chamber 10 of the conventional type of double-wall structure where an outer periphery is surrounded by a heater. Then, the opening portion 23a is made airtight by a cover 23, and a processing gas is introduced to between the inside tube 1a and the outside tube 1b by a gas introduction tube not shown in the figure, this processing gas is supplied to the plural number of wafers W via a plural number of small holes 1c formed in the top portion of the inside tube 1a, and a required heat treatment is performed with respect to the wafers W while the processing gas is exhausted from the inside tube 1a by an exhaust tube (not shown).

Here, a heat retention cylinder 24 is provided between the wafer boat 21 and the cover 23 so that the heat treatment region inside the reaction chamber is insulated from the outside and so that the lower side of the reaction chamber is protected from the heat of the heat treatment region. As shown in FIG. 6, this heat retention cylinder 24 uses a cylindrical container 25 made of glass in order to prevent contamination, and is configured so that the inside of the container 25 is filled with glass wool 26 having long fibers and an insulation effect. Moreover, the container 25 has an airtight structure and the inside has a reduced pressure.

The reason why the heat retention cylinder 24 has a structure such as this is to permit periodic cleaning since the surface of the container 25 is dirtied by the adhesion of processing gas since it is inside the reaction chamber 1. Having an airtight structure means that a long time is not required for drying since the cleaning liquid is not taken into the inside of the heat retention cylinder 24. In addition, the inside of the reaction chamber must have a reduced pressure to a required degree of vacuum since thermal expansion of the air may cause the heat retention cylinder 24 to break if air at atmospheric pressure was sealed inside and heated to a temperature of around 1000° C. for example.

However, conventional heat retention cylinder 24 are made of glass and so they sometimes crack or break due to impacts sustained during its washing or transportation. The heat retention cylinder 24 is replaced when such cracking can be recognized by eye. Nevertheless, when the cracks are extremely small and cannot be recognized by eye, cleaning fluid is taken into the inside of the heat retention cylinder 24 when it is washed and the water vapor expands when it is brought into contact with the high-temperature atmosphere inside the reaction chamber 1, and causes breaking and destruction of the heat retention cylinder 24.

At the present time, there is no apparatus suitable for the detection of extremely small cracks (so-called microcracks) and changes in the pressure inside the heat retention cylinder 24, and so it is not possible to prevent destruction such as that described above.

SUMMARY OF THE INVENTION

In the light of this, the present invention has as an object the provision of a vertical type heat treatment apparatus which can be safely operated without the breaking or destruction of the heat retention cylinder. In order to attain this objective, the present invention is a vertical type of heat treatment apparatus which loads a object to be processed and housed inside a portion for the housing of the object to be processed, from the lower side of a vertical type of reaction chamber which forms a heat treatment region, while a cover provided to the heat retention portion and which is comprised of a thermal insulation material is provided to the lower side of the portion for the housing of the object to be processed so that the opening at the lower end of the reaction chamber is closed, wherein a heat retention cover is provided to make the heat retention portion airtight with respect to the heat treatment region, and the region where the heat retention portion is provided is communicated to the side of the atmosphere.

In addition, the heat retention cover can be provided to a cover for sealing a lower end opening of the reaction chamber, so that the heat retention portion is covered, or can be provided to an upper portion of a heat retention portion and separately from the cover.

In addition, the heat retention portion can use one of many types of structures and for example, can be made of glass wool housed inside the reaction chamber.

Furthermore, a cover is provided to a peripheral edge on the lower side of a cylindrical portion in which the lower end of a cover is open and an upper end is closed, and is formed with a flange portion which airtightly seals to the peripheral edge on the lower side of the reaction chamber, so that the cover can also be used as a platform for the support of the portion housing the objects to be treated. In this case, the configuration can be such that a temperature housing portion is not provided.

A vertical type of heat treatment apparatus having such a configuration can allow a required temperature to be maintained inside the heat treatment region because of the thermal insulation effect of the heat retention portion when the objects to be processed are loaded into the reaction chamber and the lower end opening portion of the reaction chamber is sealed by the cover. Then, the heat retention portion is airtightly separated from the thermal processing region by the cover and so there is no danger of contamination due to the processing gas, and hence there is no necessity for cleaning. Because of this, the heat retention portion need not be airtight, and is linked to the atmosphere and thus there is no danger of destruction due to the thermal expansion of the gas on the inside. In addition, when the cover also serves as a support platform, it is not necessary to provide a separate support platform.

DETAILED DESCRIPTION OF THE PREFERRED EMBODIMENTS

Figure 1:
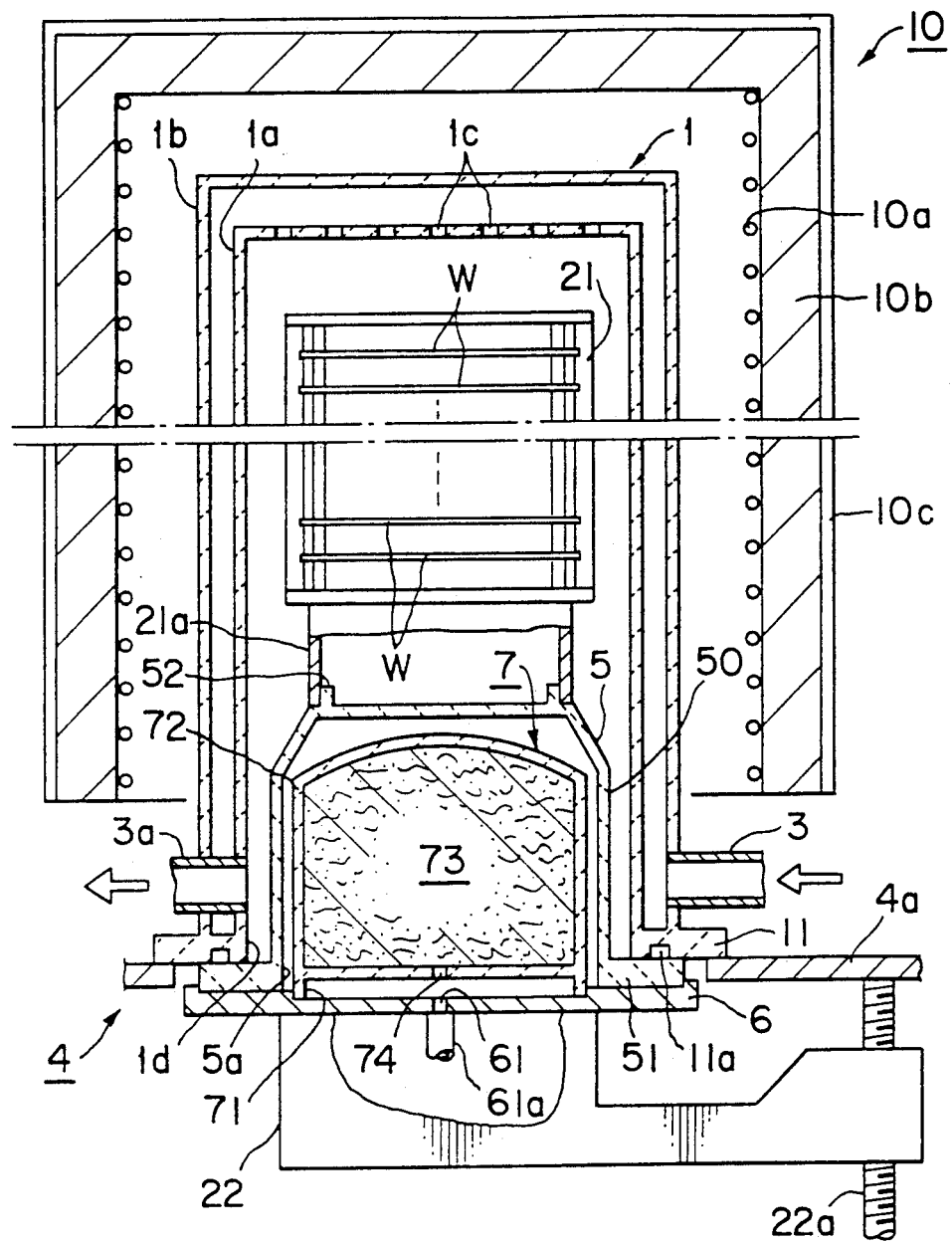
FIG. 1 is a vertical sectional view showing the entire configuration of a first embodiment of a vertical type of heat treatment apparatus according to the present invention.

FIG. 1 is a vertical sectional view showing the entire configuration where a first embodiment of the present invention has been applied to a diffusion furnace of a vertical type of heat treatment apparatus, and shows the status where the wafers which are the object to be treated are loaded into the reaction chamber. The reaction chamber 1 which forms the heat treatment region of the diffusion furnace has a double-walled structure comprising an inside tube 1a and an outside tube 1b, both of which are arranged in a substantially vertical direction, and a flange formed to the bottom end is fixed to a base plate 4a. Furthermore, a gas introduction tube 3 provided to the outside tube 1b of the reaction chamber 1 introduces gases such as processing gas and a carrier gas to a gap between the inside tube 1a and the outside tube 1b. In addition, to the top portion of the inside tube 1a are formed many fine holes 1c which form the gas flow path. An exhaust tube 3a is connected to the inside tube 1a in a configuration where exhaust is performed from the reaction chamber 1 at a required pressure.

In addition, a cover 4 for airtightly covering the lower end opening portion 1d of the reaction chamber 1 when the wafers W are loaded into the reaction chamber 1 is configured by a heat retention support plate 6 and a heat retention cylinder cover 5 which is a cover for the heat retention portion. This heat retention cylinder cover 5 has its lower end open, and comprises a cylindrical portion 50 of silica glass for example and which has the upper end closed, and a flange portion 51 formed on the lower end peripheral edge of this cylindrical portion 50. The upper surface of this flange portion 51 is in close contact with the lower surface of the flange portion 11 of the reaction chamber 1 so that the lower end opening portion 1d of the reaction chamber 1 is airtightly sealed and so that it has the role of airtightly separating the heat retention cylinder to be described later, from the heat treatment region inside the reaction chamber 1. Also, there is an air exhaust seal 11a provided between the flange portion 11 and the flange portion 51.

In addition, to the upper portion of this heat retention cylinder cover 5 is mounted a wafer boat 21 as the portion for the housing of the wafers W which are the object of processing, and the engagement of the leg portion 21a of the wafer boat 21 and the protruding portion 52 provided in the direction of the periphery of the upper surface of the heat retention cylinder cover 5 prevents the wafer boat 21 from falling out. Accordingly, in this embodiment, the cover 4 combines the role of a support platform to support the wafer boat 21.

The heat retention cylinder support platform 6 is mounted to the lower surface of this cover 5 so that the lower end opening portion 5a of the heat retention cover 5 is closed, and engages with the outer peripheral edge of the flange portion 51, is raised by a ball screw 22a and is supported by the boat elevator 22.

In the inner region surrounded by the heat retention cylinder cover 5 is arranged a heat retention cylinder 7 as the heat retention portion. This heat retention cylinder 7 is provided with a leg portion 71 to the peripheral edge of its outer surface and is supported by this leg portion 71 acting through the support plate 6. This heat retention cylinder 7 is filled with transparent, fibrous silica glass wool 73 (such as that with a density of 0.15 g/cm$^2$) as a thermal insulation material having a high thermal insulation effect to interrupt the secondary radiation of heat to the inside of the cylindrical container 72 which is made of silica glass, for example. The central portion of the heat retention cylinder support platform 6 and the lower portion of the container 72 have air (vent) holes 74, 61 (with diameters of 5 mm) formed in them and the inner cavity of the container 72 is open to the atmosphere (plant exhaust) by the exhaust tube 61 and is maintained at atmospheric pressure.

In addition, a heater 10 is provided to the periphery of the reaction chamber 1. This heater 10 is comprised from an outer shell 10c comprised of stainless steel having a thickness of approximately 1 mm, thermal insulation material 10b and a heating coil 10a.

The following is a description of a first embodiment of the present invention as described above. First, the boat elevator 22 is lowered to a positioned on the lower side of the reaction chamber 1, and 99 or some other number of yet to be processed wafers W are loaded. After this, the wafer boat 21 is raised to a position whereby the cover 4 seals the lower end opening portion 1d of the reaction chamber 1 by the flange portion 51 of the heat retention cylinder cover 5, and the wafer boat 21 is loaded into the reaction chamber 1. Then, N$_2$ gas is introduced into the reaction chamber 1 at atmospheric pressure and then after the inside of the reaction chamber 1 has been heated by the heater 10 to a required temperature, the processing gas (at a temperature of about 20° C.) introduced from the gas introduction pipe 3 to inside the inside tube 1a and is exhausted from the exhaust tube 3a while the inside of the reaction chamber 1 is held at a required pressure and a process such as diffusion treatment is performed with respect to the wafers W. Here, there is a large temperature difference between the inside of the reaction chamber 1 and the lower side but the thermal insulation effect of the heat retention cylinder 7 maintains the heat treatment region at a uniform temperature and also suppresses the rise in temperature of the lower side of the reaction chamber 1.

The inside of the heat retention cylinder 7 is at a fairly high temperature but as has been described above, the air holes 74, 61 allow air to pass to outside and so the heat heat retention cylinder 7 is held at atmospheric pressure, and thus destruction of the heat retention cylinder 7 due to thermal expansion is prevented. In addition, the heat retention cylinder cover 5 airtightly separates the heat retention cylinder 7 from the heat treatment region and so the gas which is discharged from the inside of the heat retention cylinder 7 is not taken into the heat treatment region, and conversely, the processing gas from inside the reaction chamber 1 does not contact the heat retention cylinder 7. Accordingly, it is no longer necessary to have conventionally required cleaning of the heat retention cylinder 7 since there is no contamination due to the processing gas.

Figure 2:
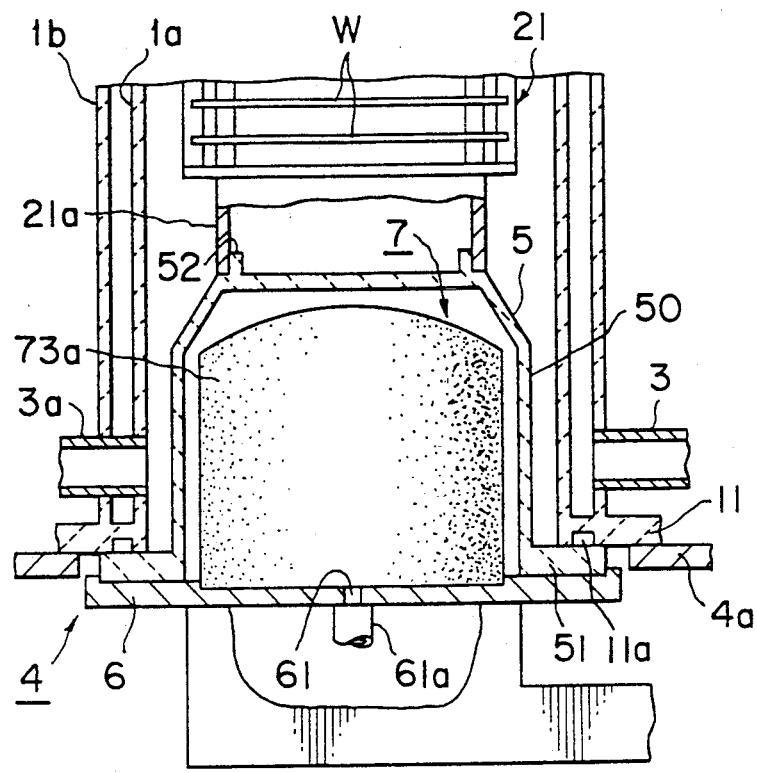
FIG. 2 is a vertical sectional view showing the entire configuration of a second embodiment of a vertical type of heat treatment apparatus according to the present invention.

The following is a description of a second embodiment of the present invention applied to a diffusion furnace of a vertical type heat treatment apparatus, and with reference to FIG. 2.

In this second embodiment, instead of the cylindrical container 72 shown for the first embodiment, uses a cylindrical shaped solid formed from foamed silica glass 73a. This foamed body 73a produces substantially the same effect as that of the first embodiment, and does not require the separate provision of air holes as the entire body is in contact with the atmosphere via the exhaust pipe 61a.

In addition, a laminated body formed of alumina ($Al_2O_3$) or ceramic (such as SiC and the like) can be used instead of the foamed body 73a.

The present invention is not limited in application to diffusion furnaces at normal pressure as described above, but can be applied to heat treatment devices which perform heat treatment such as oxidation, CVD or etching and the like under reduced pressures.

Figure 3:
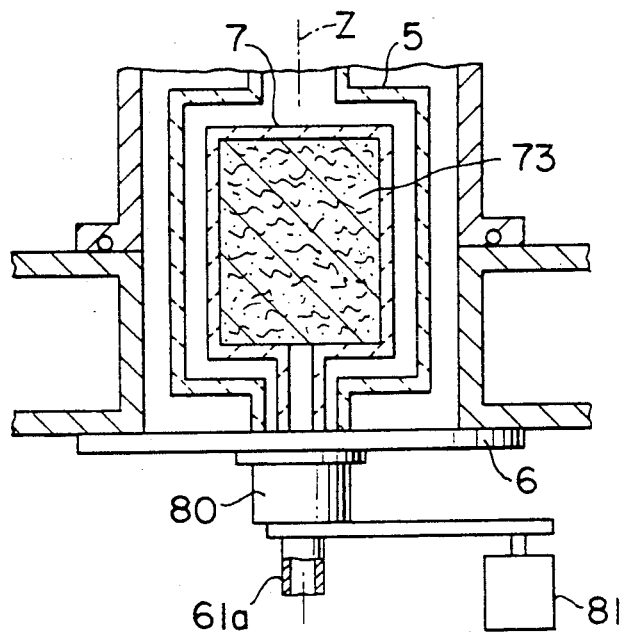
FIG. 3 is a vertical sectional view showing the heat retention portion of a third embodiment of a vertical type of heat treatment apparatus according to the present invention and where the heat retention cylinder is rotationally driven.

Also, as shown in FIG. 3, a third embodiment of the present invention is applied to an apparatus having a structure which rotates a wafer boat 21 about a vertical axis 8. When the present invention is applied to a structure which rotates the waver boat 21, there is provided a rotation mechanism 81 and a rotating shaft portion 80 which follows the magnetic seal portion at the lower surface of the heat retention cylinder cover 5. In this structure, the wafer boat 21 is rotated via the heat retention cylinder 7 and the rotating shaft portion 80 due to the rotation mechanism 81. The exhaust pipe 61a is in contact with the heat retention cylinder 7 which houses the silica glass wool and the inside is therefore communicated to the atmosphere.

Figure 4:
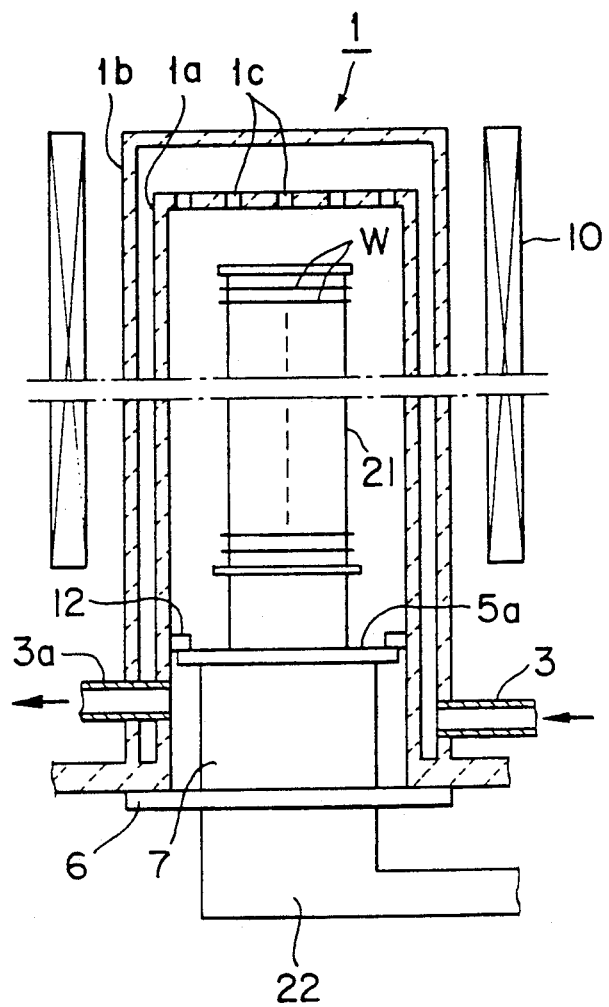
FIG. 4 is a vertical sectional view showing the entire configuration of a fourth embodiment of a vertical type of heat treatment apparatus according to the present invention.
Figure 5:
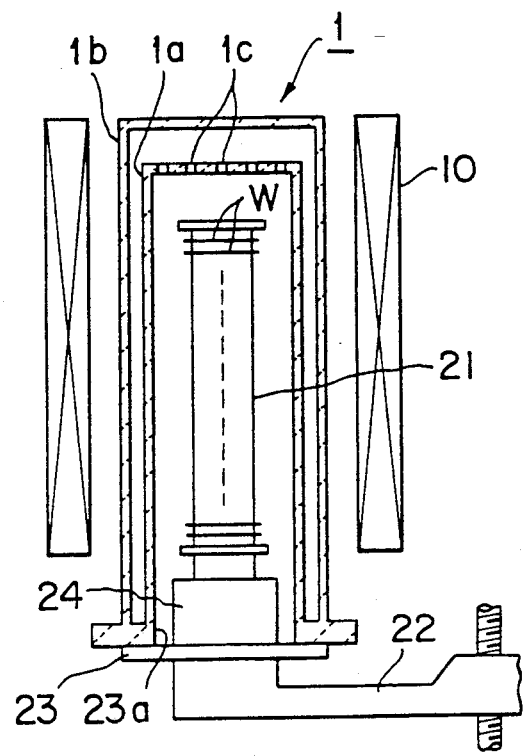
FIG. 5 is a vertical sectional view showing the entire configuration of a conventional type of vertical type of heat treatment apparatus.
Figure 6:
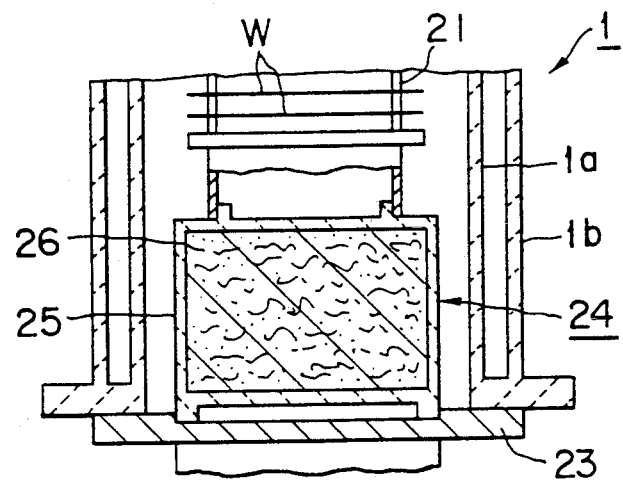
FIG. 6 is an enlarged vertical sectional view of a heat retention portion of the vertical type of heat treatment apparatus shown in FIG. 5.

The following is a description of a fourth embodiment of the present invention. In this embodiment, the heat retention cylinder cover 5a can have the role of airtightly separating the heat retention cylinder 7 from the heat treatment region and so as shown in FIG. 4, it is formed in a disk shape and the silica glass wool inside it is arranged in the upper portion of the housed heat retention cylinder 7, and the edge of the heat retention cylinder cover 5a is in close contact with the protruding portion 12 provided to the inner peripheral edge of the inside cylinder 1b, thereby airtightly separating the upper side and the lower side of the heat retention cylinder cover 5a. The heat retention cylinder 7 is of course communicated with the atmosphere.

Also, in the present invention, instead of a structure where glass wool is filled inside the container 72, there can be a structure whereby silica glass plates are blast processed and made opaque. In addition, the heat retention cylinder 7 is airtightly separated from the heat treatment region and so there is no source of its contamination. It is therefore possible to configure the heat retention cylinder portion from some insulation material other than silica glass. More specifically, the heat retention portion can use one of many types of configurations which include insulation blocks of alumina or the like, or where these insulation blocks are mounted on a blasted silica glass structure.

Conventionally, positioning a wafer boat inside a region of uniform temperature which has been heated by a heater has always involved a heat retention cylinder which also has the role of a support platform, between the cover and the wafer boat in cases when the heat processing temperature is not especially high. However, for example, as shown by the first embodiment in FIG. 1, when the cover also combines the support platform for the wafer boat, it is not necessary to have the heat retention cylinder and so the structure becomes simpler. When there is such a structure, it is not necessary to have a heat retaining portion such as the heat retention cylinder or the like when the temperature of the heat treatment region is a low temperature of 500° C. or less, for example. In addition, the reaction chamber need not necessarily have a double-walled structure, and can have a single-walled structure.

According to the present invention, it is possible to have airtight separation of the heat retention portion with respect to the heat treatment region through the use of a heat retention portion cover and so the heat retention portion is not contaminated by the processing gas and the like and consequently it is not necessary to clean it. Accordingly, the heat retention portion need not have an airtight structure and so there is no danger of breakage as in the case of conventional heat retention portions. Not only this, the heat retention portion itself does not become a source of contamination in the heat treatment and so it is possible to use materials other than silica glass, thereby reducing the structural restrictions and allowing greater freedom of design.

According to the present invention, the structure is such that silica glass wool is housed inside a container and so there is an extremely large insulation effect and the region in which the heat retention portion is arranged is in contact with the atmosphere. Because of this, the inside of the container does not have to have a sealed structure, and can be open to the atmosphere. As a result of this, it is possible to have the two practical advantages of both safety and a high insulation effect.

Furthermore, according to the present invention, the structure is such that the cover combines the function of a support platform for the portion housing the objects to be treated and so the portion housing the objects to be treated need not be placed on a separate support platform and raised into the region for heating by the heater. The structure is therefore simplified.

What is claimed is:

1. A heat treatment apparatus, comprising:
   a reaction chamber forming a heat treatment region, said reaction chamber having an opening at one end;
   a heat retention portion formed of thermally insulating material;
   a heat retention support plate, provided at said end of said reaction chamber for closing said opening and supporting said heat retention portion, said heat retention portion being in communication with an outside atmosphere; and a heat retention cover provided around said heat retention portion so as to airtightly separate said heat retention portion from said heat treatment region.

2. A heat treatment apparatus according to claim 1, wherein said heat retention support plate and said heat retention cover cooperate to close said opening.

3. A heat treatment apparatus according to claim 1, wherein said heat retention cover is provided on said heat retention support plate.

4. A heat treatment apparatus according to claim 1, wherein said heat retention support plate has vent holes for providing communication between said heat retention portion and an outside atmosphere.

5. A heat treatment apparatus according to claim 1, wherein said heat retention portion includes a container housing silica glass, said container communicating with an outside atmosphere.

6. A heat treatment apparatus according to claim 1, wherein said heat retention portion is cylindrically shaped.

7. A heat treatment apparatus according to claim 6, wherein said heat retention portion includes a cylindrically shaped and integrally formed foamed glass body, said foamed glass body communicating with an outside atmosphere.

8. A heat treatment apparatus according to claim 6, wherein said heat retention portion includes a cylindrically shaped and integrally formed foamed ceramic or alumina body, said foamed ceramic or alumina body communicating with an outside atmosphere.

9. A heat treatment apparatus according to claim 1, wherein a heat retention cylinder housing an insulating material is provided inside said heat retention portion, said heat retention cylinder being freely rotatable and in communication with an outside atmosphere.

10. A heat treatment apparatus according to claim 1, wherein said heat retention portion includes a heat retention cylinder having an edge around a periphery;

said heat retention cover is provided on an upper portion of said heat retention cylinder; and a protruding portion is provided to an inner peripheral edge of said reaction chamber, such that said protruding portion and said heat retention cover cooperate to airtightly separate said heat retention cylinder from said heat treatment region.

* * * * *